United States Patent [19]

Nishi et al.

[11] Patent Number: 5,279,918

[45] Date of Patent: Jan. 18, 1994

[54] PHOTORESIST COMPOSITION COMPRISING A QUINONE DIAZIDE SULFONATE OF A NOVOLAC RESIN

[75] Inventors: Mineo Nishi; Koji Nakano; Tadashi Kusumoto; Keisuke Nakano; Yoshihiro Takada, all of Kitakyushu, Japan

[73] Assignee: Mitsubishi Kasei Corporation, Tokyo, Japan

[21] Appl. No.: 693,648

[22] Filed: Apr. 30, 1991

[30] Foreign Application Priority Data

| May 2, 1990 [JP] | Japan | 2-116476 |
|---|---|---|
| Jul. 11, 1990 [JP] | Japan | 2-183814 |
| Aug. 30, 1990 [JP] | Japan | 2-228950 |

[51] Int. Cl.$^5$ .................. G03F 7/023; G03F 7/32
[52] U.S. Cl. .................. 430/190; 430/191; 430/192; 430/193; 430/165; 430/326
[58] Field of Search .............. 430/190, 192, 193, 165, 430/166

[56] References Cited

U.S. PATENT DOCUMENTS

| 3,046,120 | 7/1962 | Schmidt et al. | 430/192 |
|---|---|---|---|
| 3,635,709 | 1/1972 | Kobayashi | 430/190 |
| 4,306,010 | 12/1981 | Uehara et al. | 430/190 |
| 4,306,011 | 12/1981 | Uehara et al. | 430/190 |
| 4,308,368 | 12/1981 | Kubo et al. | 430/192 |
| 4,350,753 | 9/1982 | Shelnut et al. | 430/190 |
| 4,424,270 | 1/1984 | Erdmann et al. | 430/193 |
| 4,460,644 | 7/1984 | Uehara et al. | 430/190 |
| 4,477,553 | 10/1984 | Yamamoto et al. | 430/190 |
| 4,536,465 | 8/1985 | Uehara et al. | 430/192 |
| 4,719,167 | 1/1988 | Miura et al. | 430/190 |
| 4,840,869 | 6/1989 | Kita et al. | 430/190 |
| 4,859,563 | 8/1989 | Miura et al. | 430/192 |
| 5,087,548 | 2/1992 | Hosaka et al. | 430/192 |

FOREIGN PATENT DOCUMENTS

| 365318 | 4/1990 | European Pat. Off. |
| 133461 | 6/1987 | Japan . |
| 143045 | 8/1989 | Japan . |
| 2172117 | 9/1986 | United Kingdom . |
| 90/01726 | 2/1990 | World Int. Prop. O. . |

OTHER PUBLICATIONS

Patent Abstracts of Japan vol. 11, No. 181 (P-585) (2628) Jun. 11, 1987, & JP-A-62 010646 (Kanto Kagaku K.K.) Jan. 19, 1987, *the whole document*.

Primary Examiner—Charles L. Bowers, Jr.
Assistant Examiner—John S. Chu
Attorney, Agent, or Firm—Oblon, Spivak, McClelland, Maier & Neustadt

[57] ABSTRACT

A photoresist composition useful for the preparation of semiconductors and to be irradiated by light with a wavelength of from 330 to 450 nm, which comprises (1) an alkali-soluble resin, (2) a quinone-diazide type photosensitive compound and (3) a solvent, wherein (a) said quinone-diazide type photosensitive compound is composed mainly of a quinone-diazide sulfonate of a novolac resin produced by polycondensation of at least one phenolic compound of the following formula (A1) or (A2) and at least one ketone or aldehyde derivative of the following formula (B),

(b) the weight-average molecular weight (the analytical value calculated as polystyrene by gel permeation chromatography) of said novolac resin is from 400 to 2,000 in the case of the novolac resin derived from the phenolic compound of the formula (A1) and from 600 to 2,200 in the case of the novolac resin derived from the phenolic compound of the formula (A2), and

(c) the esterification ratio of said quinone-diazide sulfonate (the number of quinone-diazide sulfonyl groups per molecule of the quinone-diazide sulfonate × 100/the number of hydroxyl groups per molecule of the novolac resin) is from 40 to 90%:

(A1)

-continued

(A2)

(B)

wherein R is an alkyl group or an aryl group, provided that a plurality of R may be the same or different, $R^1$ is an alkyl group, provided that a plurality of $R^1$ may be the same or different, each of $R^2$ and $R^3$ is a hydrogen atom, an alkyl group or an aryl group, l is an integer of from 0 to 3, m is an integer of from 0 to 2 and n is an integer of from 2 to 4, provided that the sum of m+n is from 2 to 4.

7 Claims, 1 Drawing Sheet

FIGURE 1

PHOTORESIST COMPOSITION COMPRISING A QUINONE DIAZIDE SULFONATE OF A NOVOLAC RESIN

The present invention relates to a photoresist composition useful for the preparation of semiconductors. Particularly, it relates to a photoresist composition useful for the preparation semiconductors, which has a high resolution and is capable of presenting an excellent pattern profile after development.

A photoresist usually comprises (1) an alkali-soluble resin, (2) a photosensitive compound and (3) a solvent. As a photoresist for semiconductors which is commonly employed at present, there is one wherein a novolac resin is used as the alkali-soluble resin and an ester of naphthoquinonediazide sulfonyl chloride with hydroxybenzophenone is used as the photosensitive agent and such an alkali-soluble resin and a photosensitive agent are dissolved in a solvent such as ethyl cellosolve acetate (e.g. Japanese Unexamined Patent Publications No. 17112/1983 and No. 136637/1987). Various pattern forming processes are known by using such a photoresist for semiconductors. For example, a process is known which comprises irradiating light (exposure) to the photoresist for semiconductors coated on a wafer of e.g. silicon or gallium arsenic single crystal and dissolving and removing the exposed areas by means of an alkaline aqueous solution as the developer. The mechanism of this process is based primarily on the following two principles:

(1) The photosensitive agent inhibits the solubility of the novolac resin to the alkaline developer (hereinafter this inhibiting effect is called a masking effect). Due to this masking effect, the solubility of the unexposed areas of the novolac resin containing the photosensitive agent to the alkaline developer substantially decreases as compared with the case of the novolac resin alone. It is known by various literatures that photosensitive groups (such as naphthoquinonediazide sulfonyl groups) in the molecules of the photosensitive agent are concerned with the masking effect (e.g. Polymer Engineering and Science, July 1989, Vol. 29, No. 14, J. Photopolymer Sci. Technol., Vol. 2, No. 3, 1989, p 401–407). When the same photosensitive agent is used, the larger the quantity of the photosensitive groups in the resist, the better the masking effect.

(2) When light at a wavelength of from 200 to 500 nm is irradiated to the photoresist for semiconductors coated on a wafer, the photosensitive agent in the resist is decomposed by light to form indene carboxylic acid, whereby the solubility of the exposed areas to an alkaline developer is improved.

Thus, there is a substantial difference in the solubility to the alkaline developer between the irradiated portions and the non-irradiated portions of the photoresist. This difference is essential to obtain a good pattern profile after the development.

Exposure of the photoresist for semiconductors has been conducted by a g-line (wavelength: 436 nm) stepper. Recently, however, exposure by i-line (wavelength: 365 nm) has been mainly employed for such a reason that resolution can be improved and the depth of focus can thereby be made long.

With a photoresist for semiconductors having a high resolution developed in recent years, the amount of the photosensitive groups in the resist is increased to increase the masking effect thereby to improve the resolution (e.g. Japanese Unexamined Patent Publication No. 136637/1987, Japanese Journal of Applied Physics, Vol. 28, No. 10, October, 1989, p. 2,110–2,113). However, if the amount of the photosensitive groups is increased, a decrease in the sensitivity is unavoidable. Especially, in the region of i-line (wavelength: 365 nm) which has been commonly employed for semiconductor lithography in recent years, absorption of light by the photosensitive agent is substantial, whereby the decrease in the sensitivity tends to be more remarkable. Further, when i-line is used, the difference in the energy of the transmitted light between the top and the bottom of the resist layer coated on the wafer is substantial, whereby the pattern profile tends to be a trapezoid and can not be an ideal rectangle. If the amount of the photosensitive groups is reduced, the sensitivity can be improved, but no adequate masking effect can be obtained, whereby deterioration of the pattern profile will be substantial.

On the other hand, a photoresist for semiconductors is known wherein the naphthoquinonediazide compound as a photosensitive component is bonded to a novolac resin used as an alkali-soluble resin, instead of being bonded to a hydroxybenzophenone, and the bonded naphthoquinonediazide compound is used as a photosensitive agent (e.g. U.S. Pat. No. 3,046,120 and Japanese Unexamined Patent Publication No. 160444/1987). Namely, the novolac resin being an alkali-soluble resin itself has hydroxyl groups, and it is therefore reacted with naphthoquinonediazide sulfonyl chloride to form a product which is useful as a photosensitive agent.

However, this photoresist is very poor in the resolution. Especially, the novolac resin having the photosensitive component bonded thereto serves also as an alkali-soluble resin and thus has a large molecular weight, whereby it is impossible to obtain a high level of resolution adequate for the preparation of a highly integrated circuit.

Further, in the field of lithography, an esterified product of a novolac resin with naphthoquinonediazide sulfonyl chloride is practically used as a photosensitive agent on the basis of the same idea as described above (Japanese Examined Patent Publication No. 28403/1968 and Japanese Unexamined Patent Publication No. 1044/1981). However, disclosed in these publications are the improvements directed to the resistance against the treating chemical reagents or the printing resistance during the printing operation, and no substantial study is made in connection with the resolution which is important to semiconductor lithography.

In recent years, it has been reported that an esterified product of a novolac resin with naphthoquinonediazide sulfonyl chloride has a high masking effect (e.g. SPIE, Vol. 1086, Advances in Resist Technology and Processing VI (1989)/363-373). However, such report is not concerned with the performance as a photoresist for semiconductors or with the practical application.

Under these circumstances, it is an object of the present invention to provide a photoresist composition having a resolution higher than the conventional products and a practical sensitivity and being capable of providing a good pattern profile.

The present inventors have conducted an extensive study to solve such problems and as a result, have found that a photoresist containing as a photosensitive compound obtained by bonding a quinone-diazide compound as a photosensitive component to a low molecular weight novolac resin synthesized from a specific phenolic compound and a ketone or aldehyde derivative, which is independent from an alkali-soluble resin as one of the main components of the photoresist, has a resolution higher than the conventional products and a practical sensitivity and is capable of providing a good pattern profile. The present invention has been accomplished on the basis of this discovery.

Thus, the present invention provides a photoresist composition useful for the preparation of semiconductors and to be irradiated by light with a wavelength of from 330 to 450 nm, which comprises (1) an alkali soluble resin, (2) a quinone-diazide type photosensitive compound and (3) a solvent, wherein (a) said quinone-diazide type photosensitive compound is composed mainly of a quinone-diazide sulfonate of a novolac resin produced by polycondensation of at least one phenolic compound of the following formula (A1) or (A2) and at least one ketone or aldehyde derivative of the following formula (B), (b) the weight-average molecular weight (the analytical value calculated as polystyrene by gel permeation chromatography) of said novolac resin is from 400 to 2,000 in the case of the novolac resin derived from the phenolic compound of the formula (A1) and from 600 to 2,200 in the case of the novolac resin derived from the phenolic compound of the formula (A2), and (c) the esterification ratio of said quinone-diazide sulfonate (the number of quinone-diazide sulfonyl groups per molecule of the quinone-diazide sulfonate × 100/the number of hydroxyl groups per molecule of the novolac resin) is from 40 to 90%:

wherein R is an alkyl group or an aryl group, provided that a plurality of R may be the same or different, $R^1$ is an alkyl group, provided that a plurality of $R^1$ may be the same or different, each of $R^2$ and $R^3$ is a hydrogen atom, an alkyl group or an aryl group, l is an integer of from 0 to 3, m is an integer of from 0 to 2 and n is an integer of from 2 to 4, provided that the sum of m +n is from 2 to 4.

In the accompanying drawing, In FIG. 1, reference numeral 1 indicates a substrate, and numeral 2 indicates a pattern angle.

Figure 1:
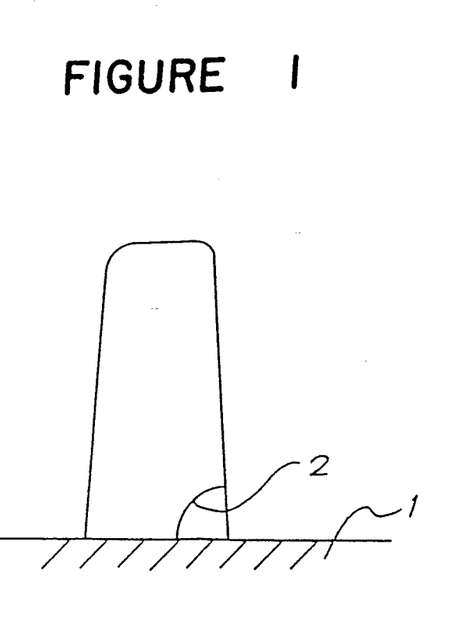
FIG. 1 is a diagrammatical view of the cross sectional shape of a pattern formed by patterning using a photoresist composition.

Now, the present invention will be described in detail.

In the photoresist composition of the present invention, the alkali-soluble resin may, for example, be a novolac resin, a resol resin, a polyvinylphenol resin or a polyacrylate resin. Among them, the novolac resin is preferred. However, the molecular weight of this alkali-soluble resin is larger than the molecular weight of the novolac resin constituting a photosensitive compound which will be described hereinafter and is definitely distinguished therefrom. Namely, the weight-average molecular weight (the analytical value calculated as polystyrene by gel permeation chromatography) of the alkali-soluble resin in the photoresist composition of the present invention is usually from 3,000 to 20,000.

There is no particular restriction as to the novolac resin to be used as the alkali-soluble resin. However, it is preferred to employ, for example, a novolac resin obtained by polycondensation of two or more phenol derivatives or polyhydroxybenzene derivatives selected from phenols such as phenol, o-cresol, m-cresol, p-cresol, 2,5-xylenol and 3,5-xylenol or from polyhydroxybenzenes such as resorcinol, 2-methylresorcinol, 5-methylresorcinol and pyrogallol, with one or more aldehydes or ketones selected from formaldehyde, acetaldehyde, benzaldehyde and acetone.

More preferably, it is a novolac resin obtained by polycondensing a mixture of m-cresol, p-cresol and 2,5-xylenol, with formaldehyde, or a novolac resin obtained by polycondensing a mixture of m-cresol, p-cresol, 2,5-xylenol and resorcinol, with formaldehyde. The mixing ratio (molar ratio) of m-cresol, p-cresol, 2,5-xylenol and resorcinol is usually 1–7:3 7:0.5–5:0–1.

In the present invention, it is essential to use a quinone-diazide sulfonate of a novolac resin having a low molecular weight as the quinone-diazide type photosensitive compound. The novolac resin to constitute the quinone-diazide sulfonate is a condensation product of the phenol compound of the formula (A1) and/or (A2) with the ketone or aldehyde derivative of the formula (B). So long as the quinone-diazide type photosensitive compound satisfies the requirements of the present invention, a photoresist having a good resolution can be obtained in either case where the phenolic compound is of the formula (A1) or (A2). However, when the phenolic compound of the formula (A2) is used, excellent effects can be obtained particularly with respect to the heat resistance.

In the formula (A1), the alkyl group for R may, for example, be a methyl group, an ethyl group, a propyl group or a butyl group, and the aryl group may, for example, be a phenyl group, and l is an integer of from 0 to 3, and when l is 2 or 3, the plurality of R may be different, but they are preferably the same.

Specific examples of the phenolic compound of the formula (A1) include phenol, an alkyl phenol such as o-cresol, m-cresol, p-cresol, 3-ethylphenol, p-tert-butylphenol, 2,5-xylenol, 3,5-xylenol, 2,3,5-trimethylphenol, 2,3,6-trimethylphenol or 2,4,6-trimethylphenol, and an arylphenol such as o-hydroxydiphenyl or p-hydroxydiphenyl. Among them, a compound of the formula (A1) wherein R is an alkyl group, and l is an integer of from 0 to 3, such as phenol or an alkylphenol, is preferred. More preferably, it is an alkylphenol wherein R is an alkyl group, and l is an integer of from 1 to 3. There is no particular restriction as to the number of carbon atoms of the alkyl group for R, but the carbon number is preferably from 1 to 4. If the carbon number exceeds 4, the heat resistance tends to decrease. Particularly preferred is a compound of the formula (A1) wherein R is a $C_{1-4}$ alkyl group, and l is 1 or 2. Particularly preferred as the phenolic compound of the formula (A1) is o-cresol, m-cresol, p-cresol, 2,5-xylenol or 3,5-xylenol.

When m in the formula (A2) is 2, the plurality of $R^1$ may be the same or different, but they are preferably the same. Also in the case of the phenolic compound of the formula (A2), the alkyl group for $R^1$ preferably has from 1 to 4 carbon atoms from the viewpoint of heat resistance. The phenolic compound of the formula (A2) includes, for example, resorcinols such as resorcinol, 2-methylresorcinol, 4-methylresorcinol, 5-methylresorcinol, 2-ethyl resorcinol and 2,5dimethylresorcinol, catechols such as catechol, 3-methylcatechol, 4-methylcatechol and 3,5-dimethylcatechol, and pyrogallols such as pyrogallol and 5-methylpyrogallol. It is preferably a resorcinol of the following formula (A2a) or a pyrogallol of the following formula (A2b):

(A2a)

wherein $R^{11}$ is $C_{1-4}$ alkyl group, and p is an integer of form 0 to 2, (A2b)

wherein $R^{12}$ is a $C_{1-4}$ alkyl group, and q is 0 or 1.

When p in the formula (A2a) is 2, the plurality of $R^{11}$ may be the same or different, but they are preferably the same. Particularly preferred are 2-methylresorcinol and pyrogallol.

Specific examples of the ketone or aldehyde derivative of the formula (B) include, for example, aldehydes, such as formaldehyde, acetaldehyde, propionaldehyde and benzaldehyde and ketones such as acetone, methyl ethyl ketone, diethyl ketone, acetylbenzene and benzophenone. Among them, formaldehyde, an alkylaldehyde having from 1 to 3 carbon atoms, benzaldehyde and acetone are preferred. With an alkylaldehyde or alkylketone having 3 or more carbon atoms in the alkyl group, the heat resistance tends to be low. Among the ketone or aldehyde derivatives of the formula (B), formaldehyde, acetaldehyde and acetone are particularly preferred.

As a method for producing a novolac resin (C) having a low molecular weight from the above phenolic compound and the ketone or aldehyde derivative, it is possible to employ a method of polycondensing the raw materials mentioned above in the presence of an acid catalyst in accordance with a known method. The temperature for the polycondensation reaction is, for example, from 50° to 100° C. The molecular weight of the novolac resin may be controlled by adjusting the amount of the catalyst in the case where a ketone is used as the raw material, or by controlling the amount of the aldehyde when the aldehyde is used as the raw material.

In the present invention, as the above low molecular weight novolac resin (C), it is necessary to employ the one wherein the weight-average molecular weight (the analytical value calculated as polystyrene by gel permeation chromatography) is within a specific range. This range of the weight-average molecular weight is different to some extent as between the case where the phenolic compound constituting the novolac resin is of the formula (A1) and the case where it is of the formula (A2). This is due to the fact that the phenolic compound of the formula (A2) has a larger molecular weight than the compound of the formula (A1).

Namely, when the phenolic compound of the formula (A1) is used, the weight-average molecular weight of the novolac resin (C) is required to be from 400 to 2,000, preferably from 450 to 1,800. When the phenolic compound of the formula (A2) is used, the weight-average molecular weight of the novolac resin (C) is required to be from 600 to 2,200, preferably from 700 to 2,000. If the molecular weight of this novolac resin is small, no adequate masking effect can be obtained, whereby no satisfactory pattern profile will be obtained. On the other hand, if the molecular weight is large, the sensitivity tends to deteriorate.

The low molecular weight novolac resin specified by the present invention can be produced as a product having a relatively sharp molecular weight distribution, and there is no substantial difference from the value of the number average molecular weight. The ratio of the weight-average molecular weight to the number average molecular weight increases as the molecular weight increases, and in the present invention, the ratio is usually from 1.0 to 2.0 times.

The quinone-diazide sulfonyl groups which esterify hydroxyl groups of the low molecular weight novolac resin (C) include, for example, a 1,2-benzoquinonediazide-4-sulfonyl group, a 1,2-naphthoquinonediazide-4-sulfonyl group, a 1,2-naphthoquinonediazide-5-sulfonyl group, a 2,1-naphthoquinonediazide-4-sulfonyl group, a 2,1-naphthoquinonediazide-6-sulfonyl group, a 2,1-naphthoquinonediazide-7-sulfonyl group, and a 2,1-naphthoquinonediazide-8-sulfonyl group. These groups may be used alone or in combination as a mixture. Among these groups, a 1,2-naphthoquinonediazide-4-sulfonyl group and a 1,2-naphthoquinonediazide-5-sulfonyl group are particularly preferred. The quinonediazide sulfonate of the novolac resin (C) in the present invention is preferably such that at least 50% by weight thereof is composed of a 1,2-naphthoquinonediazide-4-sulfonate and/or a 1,2-naphthoquinonediazide-5-sulfonate. When a 1,2-naphthoquinonediazide-4-sulfonate is used, a high sensitivity and a high resolution can be obtained particularly by irradiation with an ultraviolet ray having a wavelength within a range of from 330 to 420 nm. When a 1,2-naphthoquinonediazide-5-sulfonate is used, a good pattern profile can be obtained with a high resolution by irradiation with an ultraviolet ray having a wavelength within a range of from 330 to 450 nm.

The esterification ratio of the quinone-diazide sulfonate of the novolac resin (C) i.e. the esterification ratio of hydroxyl groups contained in the novolac resin (C) by quinone-diazide sulfonyl groups [the substitution ratio of quinone-diazide sulfonyl groups for hydrogen atoms of the hydroxyl groups of the novolac resin (C), which is calculated by (the number of quinone-diazide sulfonyl groups per molecule of the quinone-diazide sulfonate (D) of the novolac resin (C))×100/(the number of hydroxyl groups per molecule of the novolac resin (C))] is from 40 to 90%. This esterification ratio is influential over the properties of the photoresist. A preferred esterification ratio is from 45 to 80% when a compound of the formula (A1) is used as the phenolic compound as the starting material for the novolac resin (C), or from 40 to 70% when a compound of the formula (A2) is used as the phenolic compound.

The esterification reaction of the low molecular weight novolac resin (C) is usually conducted by reacting the novolac resin with a predetermined amount of quinone-diazide sulfonic acid chloride at room temperature in an organic solvent.

In the present invention, a product having a predetermined amount of the quinone-diazide type photosensitive component bonded to the low molecular weight novolac resin synthesized from the specific starting material as described above, is used as a photosensitive compound. In the present invention, two or more photosensitive compounds may be used in combination. Further, in the present invention, a certain amount of other photosensitive compounds may be mixed, so long as the technical concept of the present invention will not thereby be impaired.

As the solvent to be used in the present invention, any solvent may be employed so long as it is capable of dissolving the above quinone-diazide type photosensitive compound and the alkali-soluble resin. From the viewpoint of the operation efficiency, it is preferred to employ a solvent having a boiling point of from 100° to 180° C. Such a solvent include, for example, ether esters such as ethyl cellosolve acetate, methyl cellosolve acetate, propylene glycol monomethyl ether acetate, ether alcohols such as ethyl cellosolve, methyl cellosolve, propylene glycol monomethyl ether, carboxylates such as ethyl acetate and butyl acetate, ketones such as γ-butyrolactone, cyclic ketones such as cyclohexanone, carboxylates of dibasic acids such as diethyl oxalate and diethyl malonate, dicarboxylates of glycol such as ethylene glycol diacetate and propylene glycol diacetate, and oxycarboxylates such as ethyl 2-oxypropionate and ethyl 3-oxypropyonate. These solvents may be used alone or in combination as a mixture of two or more.

In the photoresist composition of the present invention, the concentration of the alkali-soluble resin is usually from 1 to 30% by weight. The concentration of the quinone-diazide type photosensitive compound is usually from 0.1 to 15% by weight. The proportion of the quinone-diazide type photosensitive compound to the alkali-soluble resin is usually from 0.1 to 0.5 time by weight.

Further, if necessary, a surfactant such as a polyoxyethylene ether or a fluorine type alkyl ester may be incorporated to the photoresist composition of the present invention to overcome a coating defect such as striation. The amount of such a surfactant is usually not higher than 2% by weight, preferably not higher than 1% by weight. Further, a dye or the like may be incorporated to minimize the influence of the irregularly reflected light from the substrate at the time of image transfer, and a sensitizer or the like may be incorporated to improve the sensitivity.

The photoresist composition of the present invention is used in accordance with a known method which includes steps of coating onto a substrate, exposure and development. The substrate on which the photoresist composition is coated, is a semiconductor substrate such as a silicon wafer. Coating of the photoresist composition on such a substrate is usually conducted by a spin coater, and the photoresist composition is coated usually in a layer thickness of from 0.3 to 5 μm. After the photoresist composition is coated, the substrate is usually heated on a hot plate or the like to remove the solvent and then subjected to exposure through a mask to fix a desired pattern on the substrate. For the exposure, light having a wavelength of from 330 to 450 nm such as g-line (436 nm) or i-line (365 nm) is preferably employed. After the exposure, the substrate is heated at a temperature of from about 90° to 120° C. for from about 60 to 120 seconds, if necessary, and then developed with an aqueous alkali solution. As the aqueous alkali solution, an aqueous solution of an inorganic alkali such as potassium hydroxide, sodium carbonate, sodium silicate, sodium methasilicate or aqueous ammonia, a primary amine such as ethylamine or n-propylamine, a secondary amine such as diethylamine or di-n-propylamine, a tertiary amine such as triethylamine or trimethylamine, or a quaternary ammonium salt such as tetramethyl ammonium hydroxide or trimethylhydroxyethyl ammonium hydroxide, is preferably employed. To the developer, an alcohol, a surfactant, etc. may be incorporated, as the case requires.

The photoresist composition of the present invention contains a photosensitive compound obtained by reacting a quinone-diazide compound as a photosensitive component with a low molecular weight novolac resin which is synthesized from a specific phenolic compound and a ketone or aldehyde derivative and which is independent from the alkali-soluble resin as one of the main components of the photoresist, and it especially has a high resolution upon exposure to i-line and is capable of providing an excellent pattern profile. Thus, it is very useful as a photoresist for the preparation of semiconductors.

Now, the present invention will be described in further detail with reference to Examples. However, it should be understood that the present invention is by no means restricted by such specific Examples.

In the following Examples, the molecular weights of the novolac resins obtained in Novolac Resin Preparation Examples 1 to 11 and 13 to 17, are represented by the weight-average molecular weights calculated as polystyrene from the results of the analyses by gel permeation chromatography. Further, the esterification ratios of the photosensitive agents obtained in Photosensitive Agent Preparation Examples 1 to 20, were calculated from the charged amounts.

NOVOLAC RESIN PREPARATION EXAMPLE 1

In a separable flask were placed 29.6 g of m-cresol, 148.4 g of p-cresol, 133.9 g of 2,5-xylenol, 193.2 g of a 37% aqueous solution of formaldehyde and 9.53 g of oxalic acid dihydrate. The reaction mixture immersed in oil bath, heated to 95° C., and stirred at this temperature for 5 hours. Then, the internal temperature was raised to 180° C. over a period of 1.5 hours, while water was distilled out of the system. Then, the internal temperature was further raised to 195° C., and an unreacted monomer was distilled off under reduced pressure of 15 Torr to obtain a novolac resin (a). The molecular weight of the resin was 3,100.

NOVOLAC RESIN PREPARATION EXAMPLE 2

A novolac resin (b) was obtained in the same manner as in Novolac Resin Preparation Example 1 except that in a separable flask were placed 203.5 g of m-cresol, 271.4 g of p-cresol, 249.6 g of a 37% aqueous solution of formaldehyde and 15.00 g of oxalic acid dihydrate. The molecular weight of this resin was 10,000.

NOVOLAC RESIN PREPARATION EXAMPLE 3

A novolac resin (c) was obtained in the same manner as in Novolac Resin Preparation Example 1 except that in a separable flask were placed 190.0 g of m-cresol, 237.5 g of p-cresol, 53.7 g of 2,5-xylenol, 254.9 g of a 37% aqueous solution of formaldehyde and 15.00 g of oxalic acid dihydrate. The molecular weight of this resin was 9,000.

NOVOLAC RESIN PREPARATION EXAMPLE 4

A novolac resin (d) was obtained in the same manner as in Novolac Resin Preparation Example 1 except that in a separable flask were placed 190.0 g of m-cresol, 237.5 g of p-cresol, 53.7 g of 2,5-xylenol, 246.0 g of a 37% aqueous solution of formaldehyde and 15.00 g of oxalic acid dihydrate. The molecular weight of this resin was 6,500.

NOVOLAC RESIN PREPARATION EXAMPLE 5

A novolac resin (e) was obtained in the same manner as in Novolac Resin Preparation Example 1 except that in a separable flask were placed 190.0 g of m-cresol, 237.5 g of p-cresol, 53.7 g of 2,5-xylenol, 9.5 g of resorcinol, 254.9 g of a 37% aqueous solution of formaldehyde and 15.00 g of oxalic acid dihydrate. The molecular weight of this resin was 8,100.

NOVOLAC RESIN PREPARATION EXAMPLE 6

A novolac resin (f) was obtained in the same manner as in Novolac Resin Preparation Example 1 except that in a separable flask were placed 475.0 g of m-cresol, 196.1 g of a 37% aqueous solution of formaldehyde and 15.00 g of oxalic acid dihydrate. The molecular weight of this resin was 986.

NOVOLAC RESIN PREPARATION EXAMPLE 7

A novolac resin (g) was obtained in the same manner as in Novolac Resin Preparation Example 1 except that in a separable flask were placed 475.0 g of p-cresol, 356.5 g of a 37% aqueous solution of formaldehdye and 15.00 g of oxalic acid dihydrate. The molecular weight of this resin was 500.

NOVOLAC RESIN PREPARATION EXAMPLE 8

A novolac resin (h) was obtained in the same manner as in Novolac Resin Preparation Example 1 except that in a separable flask were placed 203.5 g of m-cresol, 271.4 g of p-cresol, 213.9 g of a 37% aqueous solution of formaldehyde and 15.00 g of oxalic acid dihydrate. The molecular weight of this resin was 2,300.

NOVOLAC RESIN PREPARATION EXAMPLE 9

A novolac resin (i) was obtained in the same manner as in Novolac Resin Preparation Example 1 except that in a separable flask were placed 203.5 g of m-cresol, 271.4 g of p-cresol, 223.20 g of a 37% aqueous solution of formaldehyde and 15.00 g of oxalic acid dihydrate. The molecular weight of this resin was 4,000.

NOVOLAC RESIN PREPARATION EXAMPLE 10

In accordance with a method disclosed in Journal of Polymer Science, Vol, IV, 689-702, 1949, a novolac resin (j) was prepared from m-cresol and acetaldehyde. The molecular weight of this resin was 856.

NOVOLAC RESIN PREPARATION EXAMPLE 11

In accordance with a method disclosed in Journal of Polymer Science, Vol, IV, 689-702, 1949, a novolac resin (k) was prepared from m-cresol and acetaldehyde. The molecular weight of this resin was 1,011.

NOVOLAC RESIN (TRIMER OF P-CRESOL) PREPARATION EXAMPLE 12

In accordance with a method disclosed in ANGEWANDTE CHEMIE 46. JAHRGANG. S. 251-262, a trimer (l) of p-cresol having the following structural formula was prepared from p-cresol and formaldehyde. The molecular weight of this product was 348.

NOVOLAC RESIN PREPARATION EXAMPLE 13

In accordance with a method disclosed in UK Patent No. 1113759, a novolac resin (m) was prepared from pyrogallol and acetone. The molecular weight of this resin was 550.

NOVOLAC RESIN PREPARATION EXAMPLE 14

In accordance with a method disclosed in UK Patent No. 1113759, a novolac resin (n) was prepared from pyrogallol and acetone. The molecular weight of this resin was 1,250.

NOVOLAC RESIN PREPARATION EXAMPLE 15

In accordance with a method disclosed in UK Patent No. 1113759, a novolac resin (o) was prepared from pyrogallol and acetone. The molecular weight of this resin was 1,630.

NOVOLAC RESIN PREPARATION EXAMPLE 16

In accordance with a method disclosed in UK Patent No. 1113759, a novolac resin (p) was prepared from pyrogallol and acetone. The molecular weight of this resin was 4,500.

NOVOLAC RESIN PREPARATION EXAMPLE 17

In accordance with a method disclosed in Japanese Unexamined Patent Publication No. 1045/1981, a novolac resin (q) was prepared from 2-methylresorcinol and acetaldehyde. The molecular weight of this resin was 820.

The starting materials for the novolac resins in the above Novolac Resin Preparation Examples 1 to 17 and the molecular weights of the obtained novolac resins are shown in Table 1.

TABLE 1

| Novolac Resin Preparation Example No. | Novolac Resin No. | Starting materials for the novolac resins | Molecular weight (calculated as polystyrene) |
| --- | --- | --- | --- |
| 1 | (a) | m-cresol, p-cresol, 2,5-xylenol, formaldehyde | 3100 |
| 2 | (b) | m-cresol, p-cresol, formaldehyde | 10000 |

TABLE 1-continued

| Novolac Resin Preparation Example No. | Novolac Resin No. | Starting materials for the novolac resins | Molecular weight (calculated as polystyrene) |
|---|---|---|---|
| 3 | (c) | m-cresol, p-cresol, 2,5-xylenol, formaldehyde | 9000 |
| 4 | (d) | m-cresol, p-cresol 2,5-xylenol, formaldehyde | 6500 |
| 5 | (e) | m-cresol, p-cresol 2,5-xylenol, formaldehyde | 8100 |
| 6 | (f) | m-cresol, formaldehyde | 986 |
| 7 | (g) | p-cresol, formaldehyde | 500 |
| 8 | (h) | m-cresol, p-cresol, formaldehyde | 2300 |
| 9 | (i) | m-cresol, p-cresol, formaldehyde | 4000 |
| 10 | (j) | m-cresol, acetaldehyde | 856 |
| 11 | (k) | m-cresol, acetaldehyde | 1011 |
| 12 | (l) | p-cresol, formaldehyde | 348 |
| 13 | (m) | pyrogallol, acetone | 550 |
| 14 | (n) | pyrogallol, acetone | 1250 |
| 15 | (o) | pyrogallol, acetone | 1630 |
| 16 | (p) | pyrogallol, acetone | 4500 |
| 17 | (q) | 2-methylresorcinol, acetaldehyde | 820 |

PHOTOSENSITIVE AGENT PREPARATION EXAMPLE 1

29.6 g of the novolac resin (f) and 33.0 g of 1,2-naphthoquinonediazide-5-sulfonyl chloride were dissolved in a solvent mixture comprising 190.0 g of 1,4-dioxane and 50.0 g of N-methylpyrrolidone, then 12.5 g of triethylamine was dropwise added thereto. The mixture was reacted at room temperature for 2 hours. Then, the reaction solution was filtered to remove triethylamine hydrochloride. The filtrate was added to 1,000 g of water, and a precipitated photosensitive agent (p-1) was washed with water and dried. The esterification ratio of the photosensitive agent (p-1) was 50%.

PHOTOSENSITIVE AGENT PREPARATION EXAMPLE 2

A photosensitive agent (p-2) was obtained in the same manner as in Photosensitive Agent Preparation Example 1 except that 29.6 g of the novolac resin (f) and 33.0 g of 1,2-naphthoquinonediazide-4-sulfonyl chloride were dissolved in a solvent mixture comprising 190.0 g of 1,4-dioxane and 50.0 g of N-methylpyrrolidone, then 12.5 g of triethylamine was dropwise added thereto. The esterification ratio of the photosensitive agent (p-2) was 50%.

PHOTOSENSITIVE AGENT PREPARATION EXAMPLE 3

A photosensitive agent (p-3) was obtained in the same manner as in Photosensitive Agent Preparation Example 1 except that 39.4 g of the novolac resin (f) and 58.0 g of 1,2-naphthoquinonediazide-5-sulfonyl chloride were dissolved in a solvent mixture comprising 240.0 g of 1,4-dioxane and 65.0 g of N-methylpyrrolidone, then 22.1 g of triethylamine was dropwise added thereto. The esterification ratio of the photosensitive agent (p-3) was 65%.

PHOTOSENSITIVE AGENT PREPARATION EXAMPLE 4

A photosensitive agent (p-4) was obtained in the same manner as in Photosensitive Agent Preparation Example 1 except that 34.0 g of the novolac resin (g) and 38.7 g of 1,2-naphthoquinonediazide-5-sulfonyl chloride were dissolved in a solvent mixture comprising 220.0 g of 1,4-dioxane and 60.0 g of N-methylpyrrolidone, then 14.7 g of triethylamine was dropwise added thereto. The esterification ratio of the photosensitive agent (p-4) was 50%.

PHOTOSENSITIVE AGENT PREPARATION EXAMPLE 5

A photosensitive agent (p-5) was obtained in the same manner as in Photosensitive Agent Preparation Example 1 except that 34.0 g of the novolac resin (g) and 38.7 g of 1,2-naphthoquinonediazide-4-sulfonyl chloride were dissolved in a solvent mixture comprising 220.0 g of 1,4-dioxane and 60.0 g of N-methylpyrrolidone, then 14.7 g of triethylamine was dropwise added thereto. The esterification ratio of the photosensitive agent (p-5) was 50%.

PHOTOSENSITIVE AGENT PREPARATION EXAMPLE 6

A photosensitive agent (p-6) was prepared in the same manner as in Photosensitive Agent Preparation Example 1 except that 25.7 g of the novolac resin (j) and 40.9 g of 1,2-naphthoquinonediazide-5-sulfonyl chloride were dissolved in a solvent mixture comprising 179.0 g of 1,4-dioxane and 48.0 g of N-methylpyrrolidone, then 17.7 g of triethylamine was dropwise added thereto. The esterification ratio of the photosensitive agent (p-6) was 78%.

PHOTOSENSITIVE AGENT PREPARATION EXAMPLE 7

A photosensitive agent (p-7) was obtained in the same manner as in Photosensitive Agent Preparation Example 1 except that 20.2 g of the novolac resin (k) and 20.7 g of 1,2-naphthoquinonediazide-5-sulfonyl chloride were dissolved in a solvent mixture comprising 106.0 g of 1,4-dioxane and 29.0 g of N-methylpyrrolidone, then 7.87 g of triethylamine was dropwise added thereto. The esterification ratio of the photosensitive agent (p-7) was 50%.

PHOTOSENSITIVE AGENT PREPARATION EXAMPLE 8

A photosensitive agent (p-8) was obtained in the same manner as in Photosensitive Agent Preparation Example 1 except that 7.5 g of the novolac resin (n) and 18.7 g of 1,2-naphthoquinonediazide-5-sulfonyl chloride were dissolved in a solvent mixture comprising 100.0 g of 1,4-dioxane and 25.0 g of N-methylpyrrolidone, then 8.3 g of triethylamine was dropwise added thereto. The esterification ratio of the photosensitive agent (p-8) was 50%.

PHOTOSENSITIVE AGENT PREPARATION EXAMPLE 9

A photosensitive agent (p-9) was obtained in the same manner as in Photosensitive Agent Preparation Example 1 except that 7.5 g of the novolac resin (o) and 16.0 g of 1,2-naphthoquinonediazide-5-sulfonyl chloride were dissolved in a solvent mixture comprising 100.0 g of 1,4-dioxane and 25.0 g of N-methylpyrrolidone, then 7.3 g of triethylamine was dropwise added thereto. The esterification ratio of the photosensitive agent (p-9) was 43%.

PHOTOSENSITIVE AGENT PREPARATION EXAMPLE 10

A photosensitive agent (p-10) was obtained in the same manner as in Photosensitive Agent Preparation Example 1 except that 7.5 g of the novolac resin (q) and 13.90 g of 1,2-naphthoquinonediazide-5-sulfonyl chloride were dissolved in a solvent mixture comprising 100.0 g of 1,4-dioxane and 25.0 g of N-methylpyrrolidone, then 5.3 g of triethylamine was dropwise added thereto. The esterification ratio of the photosensitive agent (p-10) was 50%.

PHOTOSENSITIVE AGENT PREPARATION EXAMPLE 11

A photosensitive agent (p-11) was obtained in the same manner as in Photosensitive Agent Preparation Example 1 except that 30.0 g of the novolac resin (h) and 33.5 g of 1,2-naphthoquinonediazide-5-sulfonyl chloride were dissolved in a solvent mixture comprising 190.0 g of 1,4-dioxane and 50.0 g of N-methylpyrrolidone, then 12.7 g of triethylamine was dropwise added thereto. The esterification ratio of the photosensitive agent (p-11) was 50%.

PHOTOSENSITIVE AGENT PREPARATION EXAMPLE 12

A photosensitive agent (p-12) was obtained in the same manner as in Photosensitive Agent Preparation Example 1 except that 8.0 g of the trimer of p-cresol (l) and 5.5 g of 1,2-naphthoquinonediazide-5-sulfonyl chloride were dissolved in a solvent mixture comprising 60.0 g of 1,4-dioxane and 15.0 g of N-methylpyrrolidone, then 2.2 g of triethylamine was dropwise added thereto. The esterification ratio of the photosensitive agent (p-12) was 30%.

PHOTOSENSITIVE AGENT PREPARATION EXAMPLE 13

A photosensitive agent (p-13) was prepared in the same manner as in Photosensitive Agent Preparation Example 1 from 2,3,4,4'-tetrahydroxybenzophenone and 1,2-naphthoquinonediazide-5-sulfonyl chloride. The esterification ratio of the photosensitive agent (p-13) was 85%.

PHOTOSENSITIVE AGENT PREPARATION EXAMPLE 14

A photosensitive agent (p-14) was obtained in the same manner as in Photosensitive Agent Preparation Example 1 except that 7.5 g of the novolac resin (o), and 14.5 g of 1,2-naphthoquinonediazide-5-sulfonyl chloride were dissolved in a solvent mixture comprising 100.0 g of 1,4-dioxane and 25.0 g of N-methylpyrrolidone, then 6.6 g of triethylamine was dropwise added thereto. The esterification ratio of the photosensitive agent (p-14) was 39%.

PHOTOSENSITIVE AGENT PREPARATION EXAMPLE 15

A photosensitive agent (p-15) was obtained in the same manner as in Photosensitive Agent Preparation Example 1 except that 7.5 g of the novolac resin (i), and 8.35 g of 1,2-naphthoquinonediazide-5-sulfonyl chloride were dissolved in a solvent mixture comprising 50.0 g of 1,4-dioxane and 12.0 g of N-methylpyrrolidone, then 3.24 g of triethylamine was dropwise added thereto. The esterification ratio of the photosensitive agent (p-15) was 50%.

PHOTOSENSITIVE AGENT PREPARATION EXAMPLE 16

A photosensitive agent (p-16) was obtained in the same manner as in Photosensitive Agent Preparation Example 1 except that 7.5 g of the novolac resin (b), and 8.33 g of 1,2-naphthoquinonediazide-5-sulfonyl chloride were dissolved in a solvent mixture comprising 50.0 g of 1,4-dioxane and 12.0 g of N-methylpyrrolidone, then 3.23 g of triethylamine was dropwise added thereto. The esterification ratio of the photosensitive agent (p-16) was 50%.

PHOTOSENSITIVE AGENT PREPARATION EXAMPLE 17

A photosensitive agent (p-17) was obtained in the same manner as in Photosensitive Agent Preparation Example 1 except that 7.5 g of the novolac resin (p), and 9.13 g of 1,2-naphthoquinonediazide-5-sulfonyl chloride were dissolved in a solvent mixture comprising 100.0 g of 1,4-dioxane and 25.0 g of N-methylpyrrolidone, then 4.1 g of triethylamine was dropwise added thereto. The esterification ratio of the photosensitive agent (p-17) was 25%.

PHOTOSENSITIVE AGENT PREPARATION EXAMPLE 18

A photosensitive agent (p-18) was obtained in the same manner as in Photosensitive Agent Preparation Example 1 except that 7.5 g of di-2,3,4-trihydroxyphenyl ketone and 26.09 g of 1,2-naphthoquinonediazide-5-sulfonyl chloride were dissolved in a solvent mixture comprising 120.0 g of 1,4-dioxane and 30.0 g of N-methylpyrrolidone, then 11.9 g of triethylamine was dropwise added thereto The esterification ratio of the photosensitive agent (p-18) was 63%.

PHOTOSENSITIVE AGENT PREPARATION EXAMPLE 19

A photosensitive agent (p-19) was obtained in the same manner as in Photosensitive Agent Preparation Example 1 except that 7.5 g of the novolac resin (o) and 11.2 g of 1,2-naphthoquinonediazide-5-sulfonyl chloride were dissolved in a solvent mixture comprising 100.0 g of 1,4-dioxane and 25.0 g of N-methylpyrrolidone, then 5.1 g of triethylamine was dropwise added thereto. The esterification ratio of the photosensitive agent (p-19) was 30%.

PHOTOSENSITIVE AGENT PREPARATION EXAMPLE 20

A photosensitive agent (p-20) was obtained in the same manner as in Photosensitive Agent Preparation Example 1 except that 7.5 g of the novolac resin (m) and 25.3 g of 1,2-naphthoquinonediazide-5-sulfonyl chloride were dissolved in a solvent mixture comprising 100.0 g of 1,4-dioxane and 25.0 g of N-methylpyrrolidone, then 11.5 g of triethylamine was dropwise added thereto. The esterification ratio of the photosensitive agent (p-20) was 65%.

PHOTORESIST COMPOSITION PREPARATION EXAMPLE 1

1.92 g of the novolac resin (a) as an alkali-soluble resin and 0.58 g of the photosensitive agent (p-1) were dissolved in 7 g of ethyl cellosolve acetate, and the solution was filtered by a membrane filter having a pore size of 0.2 μm to obtain a photoresist composition (PR-1).

PHOTORESIST COMPOSITION PREPARATION EXAMPLES 2 TO 28

Photoresist compositions (PR-2) to (PR-28) were obtained in the same manner as in Photoresist Composition Preparation Example 1 except that the alkali-soluble resin and the photosensitive agent were combined in the proportions as identified in Table 2.

and then immersed in a 2.38% tetramethyl ammonium hydroxide aqueous solution for 60 seconds for development.

Patterning Method 2

A photoresist composition was coated by a spin coater on a silicon wafer and then heated on a hot plate of 80° C. for 90 seconds to remove the solvent and to form a photoresist coating layer having a thickness of 1.17 μm. This coated wafer was subjected to exposure by an i-line stepper (NA=0.50) manufactured by Nikon

TABLE 2

| Photoresist composition No. | Alkali-soluble resin | Photosensitive agent | | | | Photosensitive agent/alkali-soluble resin (charged weight ratio) |
|---|---|---|---|---|---|---|
| | | No. | Carrier | | Esterification ratio (%) | |
| | | | Novolac resin No. | Molecular weight | | |
| PR-1 | Novolac resin (a) | P-1 | (f) | 986 | 50 | 0.302 |
| PR-2 | Novolac resin (a) | P-1 | (f) | 986 | 50 | 0.393 |
| PR-3 | Novolac resin (c) | P-1 | (f) | 986 | 50 | 0.302 |
| PR-4 | Novolac resin (c) | P-1 | (f) | 986 | 50 | 0.393 |
| PR-5 | Novolac resin (e) | P-1 | (f) | 986 | 50 | 0.302 |
| PR-6 | Novolac resin (c) | P-2 | (f) | 986 | 50 | 0.302 |
| PR-7 | Novolac resin (d) | P-3 | (f) | 986 | 65 | 0.262 |
| PR-8 | Novolac resin (c) | P-4 | (g) | 500 | 50 | 0.309 |
| PR-9 | Novolac resin (c) | P-5 | (g) | 500 | 50 | 0.309 |
| PR-10 | Novolac resin (d) | P-6 | (j) | 856 | 78 | 0.248 |
| PR-11 | Novolac resin (d) | P-7 | (k) | 1011 | 50 | 0.328 |
| PR-12 | Novolac resin (d) | P-7 | (k) | 1011 | 50 | 0.271 |
| | | P-8 | (n) | 1250 | 50 | 0.093 |
| PR-13 | Novolac resin (c) | P-8 | (n) | 1250 | 50 | 0.256 |
| PR-14 | Novolac resin (a) | P-9 | (o) | 1630 | 43 | 0.274 |
| PR-15 | Novolac resin (c) | P-9 | (o) | 1630 | 43 | 0.274 |
| PR-16 | Novolac resin (c) | P-10 | (q) | 820 | 50 | 0.294 |
| PR-17 | Novolac resin (b) | P-11 | (h) | 2300 | 50 | 0.309 |
| PR-18 | Novolac resin (c) | P-12 | (l) | 348 | 30 | 0.453 |
| PR-19 | Novolac resin (c) | P-13 | *1 | 246 | 85 | 0.179 |
| PR-20 | Novolac resin (c) | P-13 | *1 | 246 | 85 | 0.269 |
| PR-21 | Novolac resin (c) | P-14 | (o) | 1630 | 39 | 0.232 |
| PR-22 | Novolac resin (d) | P-15 | (i) | 4000 | 50 | 0.310 |
| PR-23 | Novolac resin (d) | P-16 | (b) | 10000 | 50 | 0.311 |
| PR-24 | Novolac resin (c) | P-17 | (p) | 4500 | 25 | 0.373 |
| PR-25 | Novolac resin (c) | P-18 | *2 | 292 | 63 | 0.228 |
| PR-26 | Novolac resin (c) | P-13 | *1 | 246 | 85 | 0.224 |
| PR-27 | Novolac resin (c) | P-19 | (o) | 1630 | 30 | 0.329 |
| PR-28 | Novolac resin (c) | P-20 | (m) | 550 | 65 | 0.230 |

*1: 2,3,4,4'-tetrahydroxybenzophenone
*2: di-2,3,4-trihydroxyphenyl ketone

EXAMPLES, COMPARATIVE EXAMPLES AND REFERENCE EXAMPLES

Photoresist compositions (PR-1) to (PR-28) were subjected to patterning by either one of the following patterning methods 1, 2 and 3, whereby the sensitivity, the limiting resolution, the pattern profile and the heat resistance were evaluated, and the results are shown in Table 3.

Patterning Method 1

A photoresist composition was coated by a spin coater on a silicon wafer and then heated on a hot plate of 95° C. for 60 seconds to remove the solvent and to form a photoresist coating layer having a thickness of 1.17 μm. The coated wafer was subjected to exposure by an i-line stepper (NA=0.45) manufactured by Nikon and then heated on a hot plate of 110° C. for 90 seconds, and then it was immersed in a 2.38% tetramethyl ammonium hydroxide aqueous solution for 60 seconds for development.

Patterning Method 3

A photoresist composition was coated by a spin coater on a silicon wafer and then heated on a hot plate of 70° C. for 90 seconds to remove the solvent and to form a photoresist coating layer having a thickness of 1.17 μm. This coated wafer was subjected to exposure by an i-line stepper (NA=0.43) manufactured by Hitachi Co. and then heated on a hot plate of 110° C. for 90 seconds, and then it was immersed in a 2.38% tetramethyl ammonium hydroxide aqueous solution for 60 seconds for development.

TABLE 3

| | Photoresist composition No. | $E_0$*1 (msec) | Limiting resolving power (μm)*2 | Heat resistance (°C.)*3 | Pattern angle 1 (degree)*4 | Pattern angle 2 (degree)*5 | Patterning method |
|---|---|---|---|---|---|---|---|
| Examples | PR-1 | 700 | 0.45 | 110 | | 89 | 1 |
| | PR-3 | 500 | 0.45 | 110 | | 88 | 1 |
| | PR-5 | 250 | 0.45 | 115 | | 88 | 1 |
| | PR-6 | 380 | 0.45 | 110 | | 85 | 1 |

TABLE 3-continued

| | Photoresist composition No. | $E_0$*1 (msec) | Limiting resolving power (μm)*2 | Heat resistance (°C.)*3 | Pattern angle 1 (degree)*4 | Pattern angle 2 (degree)*5 | Patterning method |
|---|---|---|---|---|---|---|---|
| | PR-7 | 270 | 0.45 | 110 | | 89 | 1 |
| | PR-8 | 1050 | 0.45 | 110 | | 89 | 1 |
| | PR-9 | 420 | 0.45 | 110 | | 88 | 1 |
| | PR-10 | 680 | 0.40 | 120 | 88 | | 2 |
| | PR-11 | 550 | 0.40 | 120 | 88 | | 2 |
| | PR-12 | 450 | 0.40 | 125 | 88 | | 2 |
| | PR-13 | 490 | 0.45 | 140 | 89 | | 3 |
| | PR-14 | 500 | 0.45 | 140 | 88 | | 3 |
| | PR-15 | 620 | 0.45 | 140 | 89 | | 3 |
| | PR-16 | 470 | 0.50 | 135 | 88 | | 3 |
| | PR-2 | 1140 | 0.50 | 120 | 89 | | 3 |
| | PR-4 | 1158 | 0.55 | 120 | 89 | | 3 |
| Comparative Examples | PR-17 | 1700 | 0.80 | 115 | | 89 | 1 |
| | PR-18 | 800 | 0.55 | 110 | | 85 | 1 |
| | PR-19 | 200 | 0.70 | 120 | | 70 | 1 |
| | PR-20 | 380 | 0.60 | 130 | | 77 | 1 |
| | PR-21 | 250 | 0.70 | 120 | | 65 | 1 |
| | PR-22 | ≧2000 | — | — | | — | 2 |
| | PR-23 | ≧2000 | — | — | | — | 2 |
| | PR-24 | 350 | 0.70 | 130 | Not resolved | | 2 |
| | PR-25 | 250 | 0.80 | 120 | Not resolved | | 2 |
| | PR-26 | 450 | 0.60 | 125 | 85 | | 3 |
| | PR-27 | 250 | 0.70 | 125 | Not resolved | | 3 |
| | PR-28 | 640 | 0.60 | 140 | 85 | | 3 |

*1The exposure energy required to develop 0.8 μm line and space at a ratio of 1:1, is represented by the exposure time (msec)
*2The minimum line and space resolvable with a quantity of $E_0$.
*3When a wafer is heated on a hot plate for 5 minutes, the maximum temperature at which a 5 μm line and space pattern does not deform (provided that evaluation was made every 5° C.).
*4The angle between the cross sectional side of the line and the substrate at the minimum line and space resolvable with the quantity of exposure required to develop 0.6 μm line and space at a ratio of 1:1.
*5The angle between the cross sectional side of the line and the substrate at the minimum line and space resolvable with a quantity of exposure $E_0$.

What is claimed is:

1. A photoresist composition useful for the preparation of semiconductors and to be irradiated by light with a wavelength of from 330 to 450 nm, which comprises (1) an alkali-soluble resin, (2) a quinone-diazide type photosensitive compound and (3) a solvent, wherein
   (a) said quinone-diazide type photosensitive compound comprises a quinone-diazide sulfonate of a novolac resin produced by polycondensation of at least one phenolic compound of the following formula (A1a) and at least one member selected from the group consisting of acetaldehyde and acetone,
   (b) the weight-average molecular weight (the analytical value calculated as polystyrene by gel permeation chromatography) of said novolac resin is from 450 to 1,800,
   (c) the esterification ratio of said quinone-diazide sulfonate (the number of quinone-diazide sulfonyl groups per molecule of the quinone-diazide sulfonate × 100/the number of hydroxyl groups per molecule of the novolac resin) is from 40 to 90%, and
   (d) the quinone-diazide sulfonate is composed mainly of 1,2-naphthoquinonediazide-5-sulfonate;

(A1a)

wherein R' is a $C_{1-4}$ alkyl group, and l' is 1 or 2, wherein the alkali-soluble resin is a novolac resin having weight average molecular weight (the analytical value calculated as polystyrene by gel permeation chromatography) of from 3,000 to 20,000 and wherein alkali-soluble resin is a novolac resin obtained by polycondensation of a mixture comprising at least two phenol derivatives of m-cresol and p-cresol with one or more aldehydes or ketones.

2. The photoresist composition according to claim 1, wherein alkali-soluble resin is a novolac resin obtained by polycondensation of a mixture comprising m-cresol, p-cresol, 2,5-xylenol and resorcinol in a molar ratio of 1-7:3:-7:0.5-5:0-1 with one or more aldehydes or ketones comprising at least formaldehyde.

3. The photoresist composition according to claim 1, wherein the ratio of the weight-average molecular weight to the number average molecular weight of the novolac resin constituting the quinone-diazide sulfonate as the photosensitive compound is from 1.0 to 2.0.

4. The photosensitive composition according to claim 1, wherein the esterification ratio of the quinone-diazide sulfonate as the photosensitive compound is from 45 to 80%.

5. The photosensitive composition according to claim 1, wherein the solvent is a solvent having boiling point from 100° to 180° C. which is capable of dissolving the alkali-soluble resin and the quinone-diazide type photosensitive compound.

6. The photoresist composition according to claim 1, wherein the concentration of the alkali-soluble resin is from 1 to 30 % by weight.

7. The photoresist composition according to claim 1, wherein the concentration of the photosensitive compound is from 0.1 to 15% by weight.

* * * * *